United States Patent Office
3,480,441
Patented Nov. 25, 1969

3,480,441
PHOTOSENSITIVE COMPOSITIONS

Rangaswamy Srinivasan, Briarcliff Manor, N.Y., assignor to International Business Machines Corporation, Armonk, N.Y., a corporation of New York

No Drawing. Filed Aug. 9, 1966, Ser. No. 571,171
Int. Cl. G03c *1/68*
U.S. Cl. 96—115 8 Claims

ABSTRACT OF THE DISCLOSURE

The invention relates to photoresist compositions comprising poly 1,3-butadiene with or without alkyl substituents and a perchlorinated compound of an unsaturated nature.

This invention relates generally to photosensitive compositions and more particularly relates to photosensitive compositions which are useful as photoresists.

Photoresists are materials which under the action of radiant energy change their characteristics, by crosslinking, for example, so that they become insoluble in certain solvents and hence can be used to protect selected areas of a metal surface, for example, from the action of an etchant. There are many well-known photoresists which are commercially available but they are relatively expensive because of the complexity of their manufacturing process and because of the heretofore relatively limited market. With the advent of integrated circuit technology, photographic techniques which involve the use of photoresists have become so widespread that much greater quantities of photoresist materials are required. Because of the expanding need for these materials, cost and availability become important factors particularly where production line techninques are being used and production schedules must be met. Under such circumstances, dependence on sources of commercially available photoresists might well become a critical and intolerable factor in the manufacture of devices which require the use of photoresists.

It is, therefore, an object of this invention to provide photoresist compositions which can be made from commerically available materials.

Another object is to provide photoresist compositions which can be manufactured by relatively simple blending techniques.

Another object is to provide photoresist compositions which have a relatively wide range of speed and spectral response.

Still another object is to provide photoresist compositions which are relatively inexpensive.

Still another object is to provide photoresist compositions which when suitably processed are resistant to both acid and alkaline etches.

Yet another object is to provide photoresist compositions having an overall performance comparable to presently available photoresists.

In accordance with the teaching of the present invention, commercially available linear polymers with unsaturation either in the chain itself or in a side chain are crosslinked by photosensitive perchlorinated compounds. These compounds are capable of initiating free radical reactions as well as Diels-Alder addition and react by both of these avenues.

Linear polymers such as:

Poly-1,3-butadiene
Poly-cis-butadiene
Poly-trans-butadiene

Polybutadiene (1,2-adduct)
Polyisoprene
Poly-2,3-dimethyl butadiene
Polychloroprene which are commercially available are useful in the practice of this invention.

Crosslinking agents such as:

Perchlorofulvalene
Hexachloro-1,3-butadiene
Hexachloro-1,3-cyclopentadiene
Hexachloro 2-cyclopentenone
Chlorendic anhydride
Hexachloro[2.2.1]bicycloheptadiene
Hexachloro cyclohexa 2,4-diene-one
Hexachloro cyclohexa 2,5-dieneone
Chloranil
1,2,3,4,5,6 hexachlorbenzene which are also commercially available are useful in the practice of this invention.

One of the linear polymers and one of the crosslinking agents set out above are then mixed in suitable amounts in a solvent such as benzene to provide the photoresist compositions of the present invention. The resulting photoresist is then coated on the surface of a substrate and dried at room temperature. Upon exposure to actinic light through a mask, the unmasked or light struck areas are polymerized and an insoluble image is formed in the photoresist. The areas which are masked have not been changed so they remain soluble in benzene and are removed by washing in benzene.

Upon drying to remove the solvent and other volatile products, the substrate is subjected to the action and of an etchant. The polymerized or insoluble image resists the action of both acid and 20% alkaline solutions.

The foregoing and other objects, features and advantages of the present invention will be apparent from the following more particular description of preferred embodiments of the invention.

To obtain a photoresist composition in accordance with the present invention, any one of the linear polymers and and one of the crosslinking agents mentioned hereinabove may be blended in a suitable solvent. Once the materials are blended no further synthesis is required and the photoresist composition is ready for immediate use. The stability of the materials which make up the compositions and the simplicity of the synthesis eliminate the necessity for maintaining large quantities of synthesized photoresists on hand. The photoresist compositions of the present invention have a wide spectral response ranging from 4000 A. to 2000 A. The exposure times or speed of response, of course, varies with the relative amounts of the constituents as well as the light source, and may be varied over a relatively wide range. The compositions of the present invention in addition to acting as etch resistant masks in the formation of integrated circuit devices can also be utilized in the graphic arts in the conventional way. Apart from its function as a photoresist, the compositions of the present invention have insulating properties making them amenable for use as an insulating thin film on metallic or semiconductive substrates.

In general, to obtain the preferred compositions of the present invention one monomer equivalent of a polymer is mixed with one molecular weight of a perchlorinated compound of unsaturated nature. The following examples will indicate the proportions of the various constituents but, it should be appreciated that any one of the polymers can be reacted with any one of the perchlorinated compounds to provide a useful photoresist.

EXAMPLE I

Cis-polybutadiene and hexachlorocyclo-pentadiene

A five percent solution of cis-polybutadiene in benzene is mixed at room temperature with one-half its volume of a fifty percent solution of hexachlorocyclopentadiene in benzene. The mixture is coated on a suitable metallic surface (copper or chromium) and dried at room temperature. The resulting photoresist is then exposed to a medium pressure mercury arc lamp (Hanovia S–100) for five minutes through a mask. The unmasked or light struck areas are polymerized resulting in an image which is developed by washing in benzene. On drying at 100° F., the images become clearly visible. The image is resistant to both acid and 20% alkaline solutions. It should be appreciated that any suitable substrate such as a metal, semiconductor, glass, cloth, paper or synthetic resin may be used as a substrate.

EXAMPLE II

Poly-1,3 butadiene and perchlorofulvalene

The photoresist composition of this example is obtained in the same way as described in connection with Example I except that the polymer is poly-1,3 butadiene and the cross-linking agent is perchlorofulvalene.

EXAMPLE III

Poly-trans-butadiene and hexachloro 1,3-butadiene

The photoresist composition of this example is obtained in the same way as described in connection with Example I except that the polymer is poly-trans-butadiene and the cross-linking agent is hexachloro 1,3-butadiene.

EXAMPLE IV

Polyisoprene and chloranil

The photoresist composition of this example is obtained in the same way as described in connection with Example I except that the polymer is polyisoprene and the cross-linking agent is chloranil.

EXAMPLE V

Poly 2,3-dimethyl butadiene and 1,2,3,4,5,6-hexachlorobenzene

The photoresist composition of this example is obtained in the same way as described in connection with Example I except that the polymer is poly 2,3-dimethyl butadiene and the crosslinking agent is 1,2,3,4,5,6-hexachlorobenzene.

While the invention has been particularly shown and described with reference to preferred embodiments thereof, it will be understood by those skilled in the art that changes in form and details may be made therein without departing from the spirit and scope of the invention.

What is claimed is:

1. A photoresist composition comprising a linear polymer selected from the group consisting of poly-1,3-butadiene with alkyl substituents and poly-1,3-butadiene without alkyl substituents and a photosensitive perchlorinated compound of unsaturated nature incorporated in said linear polymer as a crosslinking agent.

2. A photoresist composition according to claim 1 wherein poly-1,3-butadiene with alkyl substituents includes polyisoprene, and poly-2,3-dimethyl butadiene.

3. A photoresist composition according to claim 1 wherein poly-1,3-butadiene without alkyl substituents includes poly-cis-butadiene, poly-trans-butadiene and poly butadiene (1,2-adduct).

4. A photoresist composition according to claim 1 wherein said perchlorinated compound of unsaturated nature includes perchlorofulvalene, hexachloro-1,3-cyclopentadiene, hexachloro-1,3-butadiene, hexachloro 2-cyclopentenone, chlorendic anhydride, hexachloro[2.2.1]bicycloheptadiene, hexachloro, cyclohexa-2,4-diene-one, hexachloro cyclohexa-2,5-dieneone, chloronil, 1,2,3,4,5,6-hexachlorobenzene.

5. A photoresist composition comprising a linear polymer selected from the group consisting of poly-1,3 butadiene, poly-cis-butadiene, poly-trans-butadiene, polybutadiene (1,2 adduct), polyisoprene, and poly-2,3 dimethyl butadiene and a photosensitive perchlorinated compound of unsaturated nature incorporated in said linear polymer as a crosslinking agent.

6. A photoresist composition according to claim 5 wherein said perchlorinated compounds of unsaturated nature include:

perchlorofulvalene, hexachloro - 1,3 - cyclopentadiene, hexachloro-1,3-butadiene, hexachloro 2-cyclopentenone, chlorendic anhydride, hexachloro[2.2.]bicycloheptadiene, hexachloro cyclohexa-2,4-diene-one, hexachloro cyclohexa-2,5-dieneone, chloranil, 1,2,3,4,5,6-hexachlorobenzene.

7. A photoresist composition according to claim 5 further including the solvent benzene.

8. The photoresist composition of claim 1 in the form of a thin film supported on a substrate matreial selected from the group consisting of metals, semiconductors, glass, paper, cloth and synthetic resins.

References Cited

UNITED STATES PATENTS

| | | | |
|---|---|---|---|
| 3,024,180 | 3/1962 | McGraw | 96—38 XR |
| 3,146,106 | 8/1964 | Hamlin | 96—115 XR |

NORMAN G. TORCHIN, Primary Examiner

R. H. SMITH, Assistant Examiner

U.S. Cl. X.R.

96—36.2